United States Patent [19]

VerPlanck

[11] Patent Number: 4,767,999
[45] Date of Patent: Aug. 30, 1988

[54] METHOD OF AND APPARATUS FOR RADIO-FREQUENCY GENERATION IN RESONATOR TANK CIRCUITS EXCITED BY SEQUENTIAL PULSES OF ALTERNATELY OPPOSITE POLARITY

[75] Inventor: Peter VerPlanck, Sudbury, Mass.

[73] Assignee: Megapulse, Inc., Bedford, Mass.

[21] Appl. No.: 929,754

[22] Filed: Nov. 12, 1986

[51] Int. Cl.$^4$ .............................................. H03B 3/00
[52] U.S. Cl. .................................... 331/166; 307/107; 307/108
[58] Field of Search ........................ 331/165, 166, 167; 307/107, 108, 414; 342/388

[56] References Cited

U.S. PATENT DOCUMENTS

| | | | |
|---|---|---|---|
| 3,711,725 | 1/1973 | Johannessen | 307/108 |
| 3,720,883 | 3/1973 | Hess, Jr. et al. | 331/166 X |
| 3,786,334 | 6/1974 | Johannessen | 321/45 |
| 3,889,263 | 6/1975 | Johannessen | 343/103 |

Primary Examiner—Eugene R. Laroche
Assistant Examiner—Robert J. Pascal
Attorney, Agent, or Firm—Rines and Rines, Shapiro and Shapiro

[57] ABSTRACT

A method of and apparatus for exciting harmonic generation of radio frequency in a tank resonant circuit by bipolar spaced, half-cycle pulses, wherein the period of the tank resonant frequency oscillations is 1/N the period between successive pulses of similar polarity, where N is an odd integer greater than unity.

11 Claims, 4 Drawing Sheets

1600A PER DIV.

500V PER DIV.

25µs/DIV.

2000A PER DIV.

200A PER DIV.

2ms/DIV.
RESONATOR CURRENT (UPPER TRACE)
CLAMPING CURRENT (LOWER TRACE)

5μs/DIV.
STEADY-STATE 80kW OPERATION ON 30.35 kHz

20μs/DIV.
START OF RESONATOR BUILD-UP, 30.35 kHz

METHOD OF AND APPARATUS FOR RADIO-FREQUENCY GENERATION IN RESONATOR TANK CIRCUITS EXCITED BY SEQUENTIAL PULSES OF ALTERNATELY OPPOSITE POLARITY

BACKGROUND OF THE INVENTION

The present invention relates to methods of and apparatus for the generation of radio-frequency pulses or continuous waves in antenna resonator circuits or similar tuned circuits through excitation by sequential pulses, being particularly useful for the generation of bursts of radio-frequency energy as for Loran-C or similar radio navigation or other pulses, or for continuous waves in resonant loads or similar systems.

The generation of such high power radio frequency pulses by successive positive and negative half-cycle d.c. pulses for such navigation pulse generation is described, for example, in U.S. Pat. No. 3,889,263; and such generation may be effected by a plurality of SCR-controlled sequential inverters connected with magnetic pulse compression circuits feeding the common high-Q antenna load as in U.S. Pat. Nos. 3,711,725 and 3,786,334.

While such systems work admirably well in practice, it has now been discovered that similar operation can be successfully obtained with much fewer required sequential inversions and otherwise less costly apparatus, and/or with excitation by fewer d.c. pulses or half-cycles that are relatively narrow and widely spaced, instead of broad and more contiguous as in the prior systems. Additionally, this technique is well suited for the generation of high power CW transmissions, particularly in the VLF band as, for example, 50 to 30 kHz.

BRIEF DESCRIPTION OF THE INVENTION

Underlying the invention is the discovery that a generator of output pulses of fixed width can be caused to deliver useful harmonic energy to a resonant circuit and its load over a range of resonant frequencies, simply by insuring that the pulse-repetition frequency and the resonant frequency are appropriately harmonically related. This enables the use of a single generator or a set of generators in a rotating or sequential time sequence to obtain more power and a smoother output wave in the resonator with the rather surprising result of a lack of a constraining relationship between the pulse half-cycle width and the resonator half-cycle width.

An object of the present invention, therefore, is to provide a new and improved method of and apparatus for such sequential pulse excitation of radio-frequency resonator, tuned or tank circuits and the like that reduce the excitation by widely spaced successive half-cycle pulses more suited, indeed, in the large current pulse, relatively infrequent switching capabilities of SCR switching circuits and the like.

A further object is to provide a novel radio-frequency generator and technique wherein harmonic energy is delivered to a resonant current and its load by bipolar pulses or the like of fixed width, and over a range of resonant frequencies, by insuring appropriate harmonic relationship of pulse repitition frequency and the resonant frequencies and without the constraint of a relationship between the pulse half-cycle width and the resonant circuit half-cycle width.

An additional object is to provide an improved sequential pulse excited tank circuit radio-frequency generator of more broad application, as well.

Other and further objects will be explained hereinafter and more particularly pointed out in the appended claims.

In summary, however, from one of its broader viewpoints, the invention embraces a method of exciting a resonant or tuned tank circuit to generate radio-frequency pulses or continuous waves by sequentially generated spaced bipolar pulses, that comprises, generating spaced half-cycle pulses of alternately opposite polarity, coupling the pulses to a resonator circuit to excite radio-frequency oscillations therein, timing the frequency of the resonant circuit to have a period 1/N that of the period between successive similar polarity pulses, where N is an odd integer greater than 1, so as to generate tank resonant frequency oscillations at the Nth harmonic of what would be a full period of said pulses, and adjusting the value of N, the width and amplitude of the pulses to cause appropriate harmonic relationship void of the constraint of a relationship between pulse and tank circuit half-cycles, the energy thereof applied to the tank circuit substantially compensating for an amount of dissipation of harmonic oscillation previously excited in the tank circuit. Preferred and best mode embodiment and details are hereinafter described.

BRIEF DESCRIPTION OF THE DRAWINGS

The invention will now be described with reference to the accompanying drawings, FIG. 1 of which is a circuit diagram of a preferred embodiment of the invention.

DESCRIPTION OF THE PREFERRED EMBODIMENT

Figure 1:
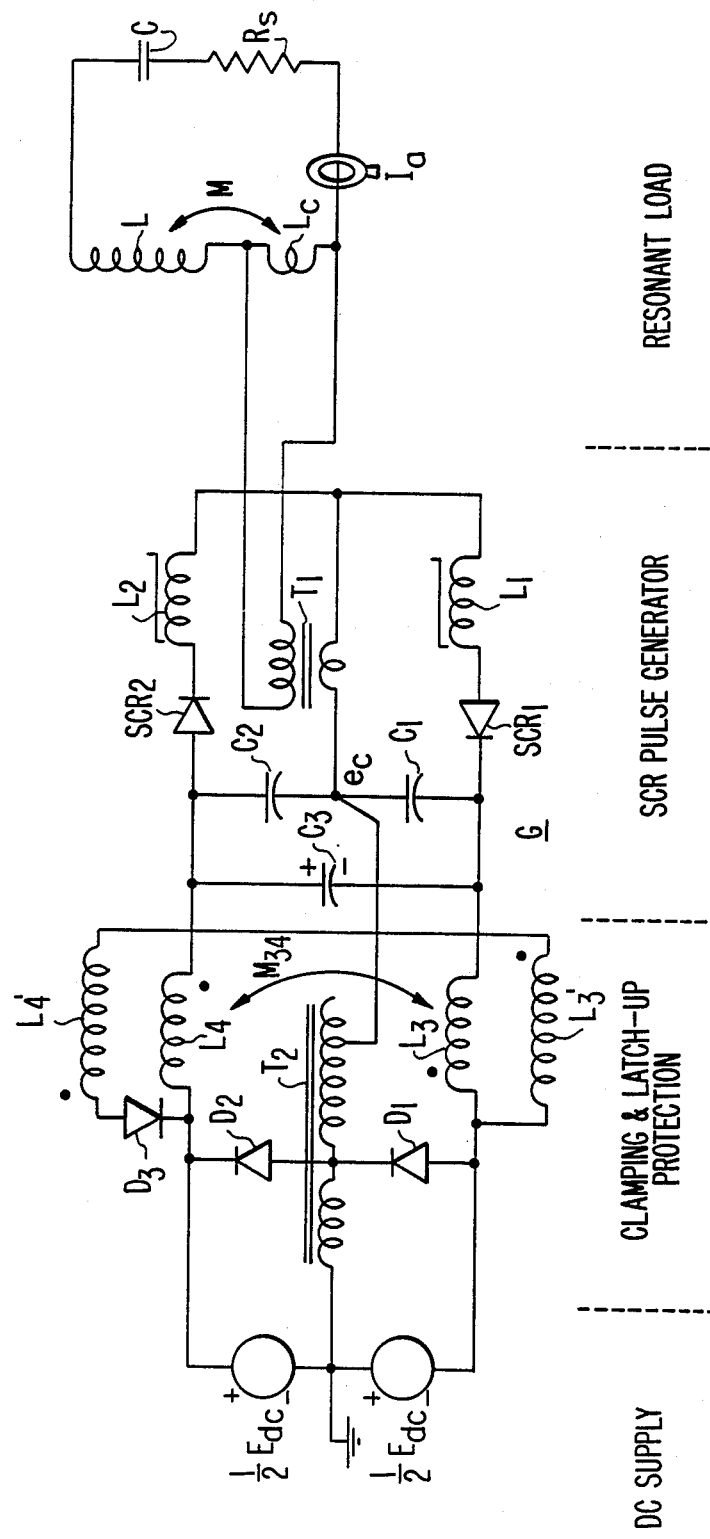

In FIG. 1, the resonant load or tank circuit is shown in the form of a tapped inductance $L$-$L_c$ resonated with a capacitor bank C at a particular critically selected frequency, later described, with the total series loss resistance $R_s$ determining how much antenna current $I_a$ can be circulated with a given source power. Adjusting the total mutual inductance $L_c$ and M provides a means for matching a given tank (or resonator) loss resistance to the capabilities of the generator at a particular frequency. The excitation of this tank circuit is from a VLF sequential inverter circuit G of the SCR pulse generating type, also later described, which is coupled to energize the tank circuit with successive current pulses in a burst. At the beginning of a burst, the VLF source delivers its pulses into a resonator without circulating energy, and the load resistance presented to the VLF inverter is virtually zero. The resonator circulating current and the coupled load voltage faced by the VLF source build up exponentially toward their steady-state levels with a time constant $\tau = Q/\pi f_o$ (where Q is that of the resonator or tank circuit including the output load; $f_o$, the resonant frequency excited therein), as does the apparent load resistance. An important feature of this generator is its current-source behavior during the interval required to fill up the resonator or tank circuit. The sharply tuned resonator will extract energy near $f_o$ from any harmonic-rich current wave passed through the coupling inductor $L_c$. In the source described here, $L_c$ is made a part of the discharge inductance in a push-pull SCR pulse generator, and receives a stream of bipolar (say, 35 μs-wide) half-sine or current pulses (i.e. alternately opposite polarity pulses). The ability of SCRs to switch narrow, high-current pulses efficiently at kHz rates is thereby exploited, without encountering the associated device limitations on recovery time and dv/dt. Between drive-current pulses, the resonator supplies VLF power to the loss resistance $R_s$, analogous to Class C vacuum-tube circuit operation. A clean sine wave will result if the resonator decay time $\tau$ is much longer than the interval between pulses. In tests over 10 to 30 kHz, successful operation was obtained with Q=200 and repetition rates from 3,000 to 6,000 pulse-pairs per second. Good d.c.-to-VLF conversion efficiency requires careful control of pulse-generator losses, since all the drive-current harmonics contribute dissipation, while only the harmonic at $f_o$ delivers useful output. Typically, 80 kw of resonator power for 100 kw of d.c. input was obtained in these tests.

Referring to the specific circuit details of the SCR pulse generator high-power circuits of the resonator exciter G, FIG. 1, the power generator is symmetrical about a horizontal center line, having upper and lower symmetrical series-connected $SCR_1$-$L_1$ and $SCR_2$-$L_2$ saturable inductor switching controls. To understand how the pulse generator G operates, suppose that the center-tapped d.c. source (½ $E_{dc}$ on a side) has been connected directly across the filter capacitor $C_3$, shunted by equal capacitors $C_1$ and $C_2$, and where $C_3 >> C_1 + C_2$, and ignore the clamping and latch-up protection circuits, so-labelled to the left, for the present. Assume that an initial positive charge has been placed at the junction of pulse capacitors $C_1$ and $C_2$, so that the voltage $e_c$ at their junction is positive with respect to ground E. $SCR_1$ is then forward-biased, while $SCR_2$ is back-biased.

When $SCR_1$ is gated on, a half-cycle sinusoidal resonant discharge of $C_1$ occurs through the primary of an output transformer $T_1$ and the saturable magnetic inductor $L_1$, where the transformer primary connects from the junction of capacitors $C_1$ and $C_2$ to the junction saturable inductors $L_1$ and $L_2$. Simultaneously, the series combination of capacitor $C_2$ and the d.c. power supply (shunted by $C_3$) discharges along the same path, which adds energy from the supply to the circuit. After half a discharge cycle, the current through $SCR_1$ reverses and $SCR_1$ turns off (pulse I in FIGS. 2 and 3B) leaving a negative voltage $e_c$ at the junction of $C_1$ and $C_2$. Now $SCR_2$ is forward-biased, $SCR_1$ is back-biased, and a small resonant-frequency current portion ($Ia_1$ in FIG. 3B) circulates in the tank.

Once sufficient time has elapsed for $SCR_1$ to recover to its insulating state, $SCR_2$ can be gated to produce an oppositely directed discharge pulse (pulse II, FIGS. 2 and 3B) through the primary of $T_1$ via inductor $L_2$. This time it is $C_2$ that has the direct discharge path, and $C_1$ whose current pulse passes out of the d.c. supply. Co-herent reinforcement of the resonator oscillation will result if the second pulse occurs an odd number (greater than 1) of tank-frequency half-cycles after the first; i.e., if the frequency $f_o$ is an odd multiple of the pulse repetition frequency. Succeeding discharge pulses will encounter ever larger levels of opposing voltage at $f_o$ on the primary of $T_1$, due to passage of the circulating current through $L_c + M$. Steady state is reached when the energy lost at $f_o$ in the load $R_s$ between pulses is just balanced by the energy pulse put into the generator from the d.c. supply during each discharge pulse.

Figure 2:
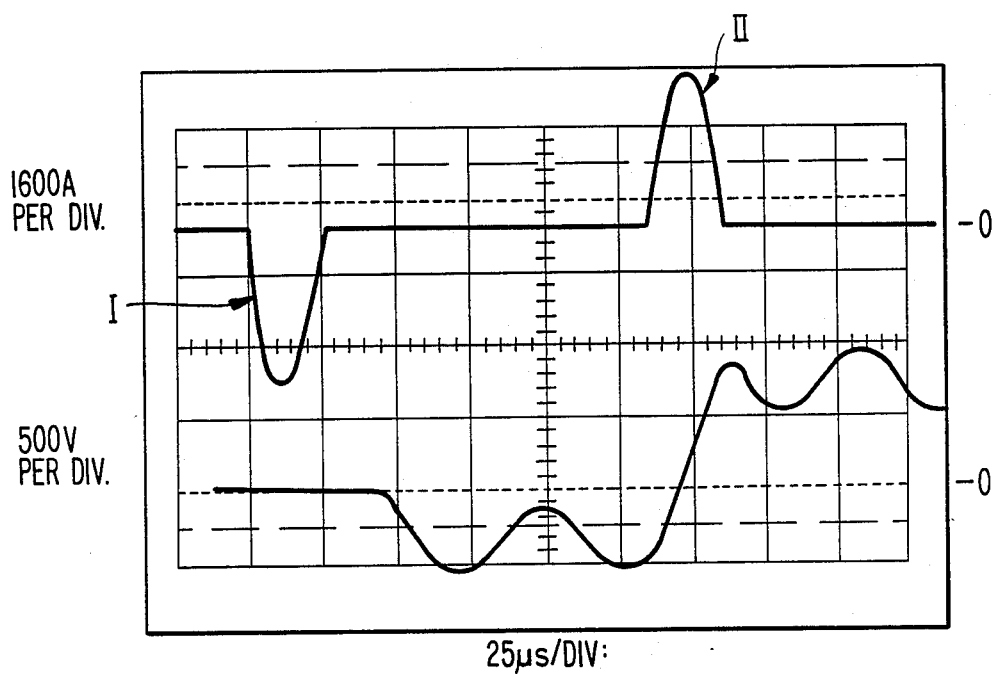
FIG. 2 is an oscillogram of the bipolar pulses produced by preferred SCR-controlled discharges of the excitation pulse generator of FIG. 1.

FIG. 2 shows the forward voltage across $SCR_1$ and the pulses of discharge current I and II through the primary of $T_1$, taken during steady-state operation on $f_o = 18$ kHz with a frequency divisor of 5 (i.e., the harmonic frequency to which the tank circuit is tuned has a period 1/5 of the period between successive pulses I). Following the conduction period of $SCR_1$ during which the negative current pulse I occurs, $SCR_1$ is back-biased by the capacitor voltage $e_c(t)$ added to the voltage coupled back from the tank resonator. When $SCR_2$ conducts to generate the positive current pulse II, forward voltage is re-applied to $SCR_1$. For FIG. 2, the resonator coupling was set close to the critical level where the back bias applied to $SCR_1$ just touches zero at the midpoint of the time available for $SCR_1$ to recover. Any more coupled voltage would cut the back-bias time of $SCR_1$ in half, and could cause $SCR_1$ to turn on accidentally, resulting in a collapse of circuit operation.

Generically stated, it has been found that if the tank frequency is tuned such that its period $T_{tank} = T/N$, where T is the period between successive similar polarity half wave pulses I, and N is an odd integer greater than 1 (say 3 or 5, for example) the sequentially operated inverter switches $SCR_1$ and $SCR_2$ will excite a tank current in successive build-up at such harmonic (FIG. 3), with the coupling inductor $L_c$ causing a 90° phase shift between such generated harmonic current in the tank circuit and that harmonic in the pulse currents applied to excite the tank circuit.

This is as contrasted from prior art excitation circuits such as in said U.S. Pat. No. 3,786,334 where the period of the frequency at which the tank circuit is tuned to resonate is equal to that of the excitation pulse frequency, requiring a large number of sequential pulses to complete the desired radio-frequency wave or a.c. pulse to be generated.

Figure 3A:
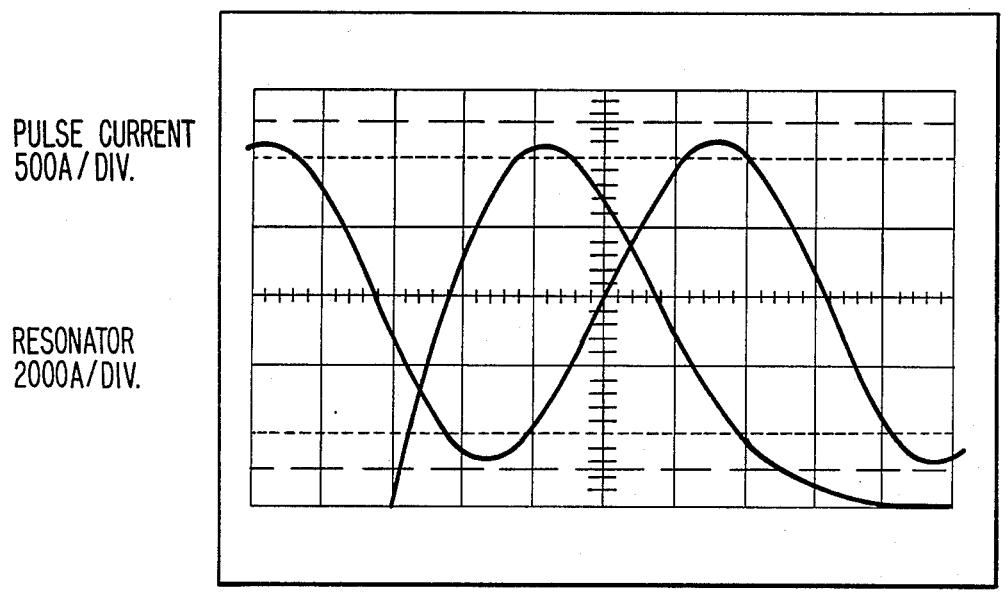
FIGS. 3A and 3B are respectively oscillograms of steady state and rsonator build-up waveforms generated in the circuit of FIG. 1.
Figure 3B:
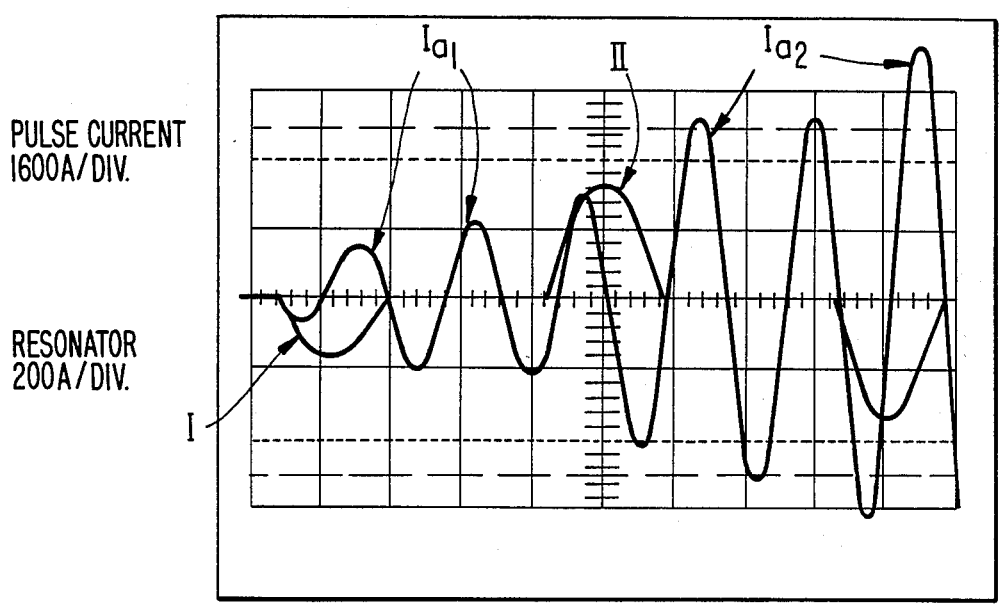

The invention, to the contrary, enables the use of large pulses (I, II), widely spaced and not contiguous, with the period of the tank circuit frequency tuned to be 1/N that of the excitation pulse period. As before stated, this is particularly suited to the SCR characteristics of facilely generating short, large current pulses, relatively infrequently. The excitation pulse repetition rate is selected so that the excitation energy of each pulse ringing the tank resonator circuit substantially equals and compensates for the energy dissipated in the ringing oscillations in the tank circuit that was caused by the preceding excitation pulse—establishing equilibrium in the remainder of the resulting radio-frequency pulse envelope. The width adjustment of each half-cycle pulse I or II, together with the amplitude and the harmonic number N, will determine the amount of the harmonically generated current in the tank circuit, FIG. 3A showing the steady-state operation (at, for example, 80 kw on 30.35 kHz). It may be noted that in this equilibrium condition, distortion has appeared in the drive pulse, relative to I and II in the build-up interval of FIG. 3B, demonstrating how a tank or resonator frequency twice the pulse frequency is generated.

Figure 4:
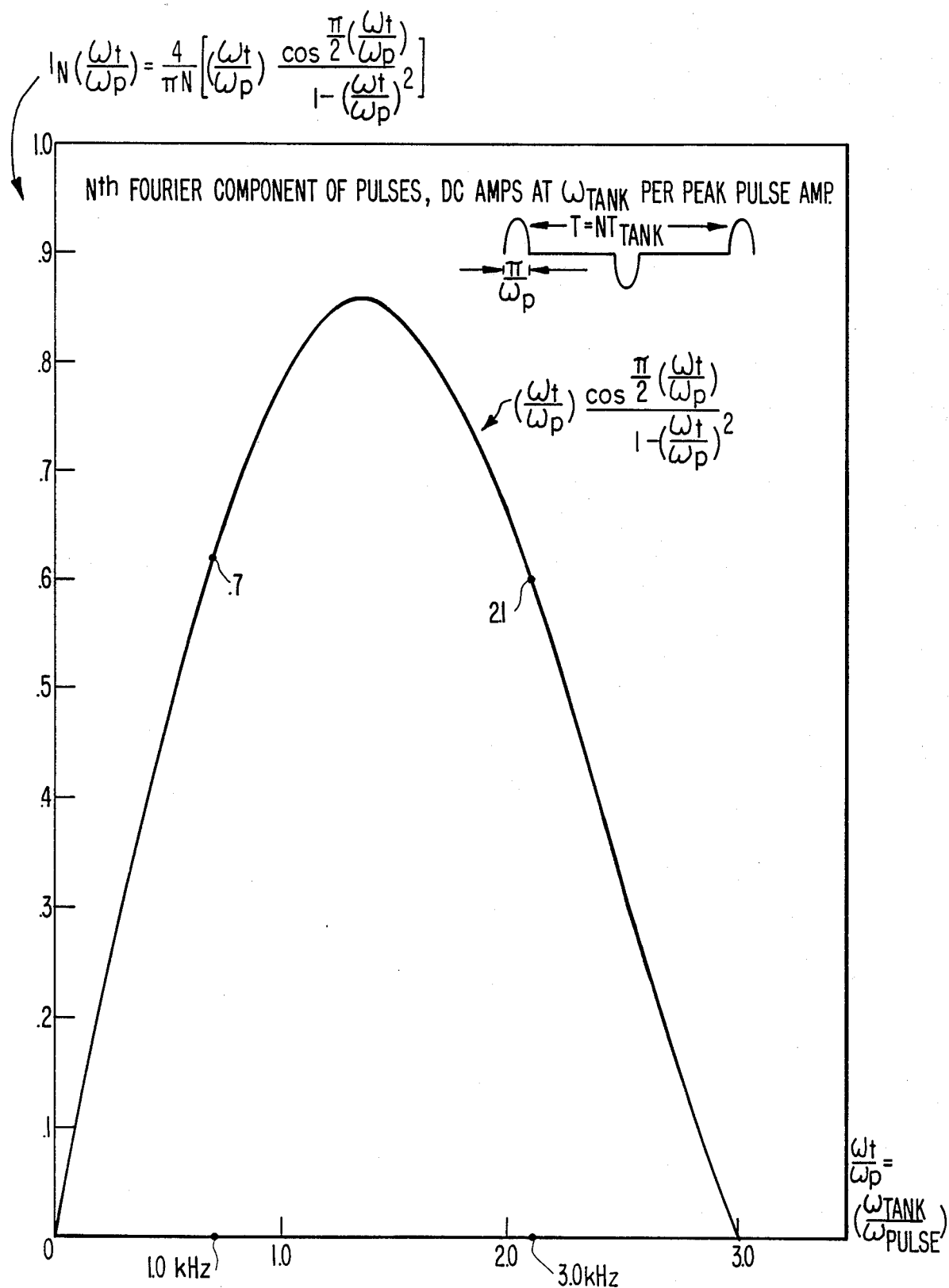
FIG. 4 is a graph showing optimum operation found to be achievable with appropriate pulse period (and width) and tank circuit resonant period adjustments in accordance with the invention.

FIG. 4 is a plot of the harmonic current $I_N(\omega t/\omega p)$ at angular frequency $\omega_{tank}$ contained in a stream of bipolar, one-ampere, half-simesoidal pulses of base width $\pi/\omega p$ seconds and occurring at an angular rate of $\omega_{tank}/N$; i.e., at a rate of one pulse repetition cycle for every N tank-frequency cycles. When multiplied by $(4/\pi)_N$, the vertical axis represents the amps of harmonic current per amp of pulse current, plotted against the ratio of tank frequency $\omega_{tank}$ to pulse-width frequency $\omega_{pulse}$. This plot, which is the Nth coefficient in a Fourier cosine series expansion of the pulse stream, gives a first approximation to the harmonic current which a pulse generator can deliver to a load resonant at $\omega_{tank}$. Once there is energy at $\omega_{tank}$ circulating in the load tank, a voltage is developed across the tank coupling impedance which opposes the passage of harmonic current, tending to reduce its magnitude below the calculated value $I_N(\omega t/\omega p)$ and producing a distortion of the basic pulse. This distortion is evident in FIG. 3A, taken with a ratio $\omega_{tank}/\omega_{pulse}$ of about 2.1.

Ratios of 0.7 and 2.1 have been marked on the axis $\omega_{tank}/\omega_{pulse}$ to show a symmetrical tank-frequency range of 3:1 within which $I_N(\omega t/\omega p) \geq 0.61$. By calculation, the generator can be operated over a 10 to 30 kHz range if the basic pulse frequency is set to 14.3 kHz. The absolute maximum tank frequency that could be generated would be $3 \times 14.3 = 42.9$ kHz.

In accordance with the invention, the harmonic current amplitude in the tank circuit is controlled by the settings of pulse current amplitude, pulse width and harmonic divisor "N". Especially, the invention provides the ability to operate over a band of tank resonant frequencies with a single generator pulse width simply by changing the pulse repetition rate and possibly the basic divisor "N". Whether the generator pulse width matches, overlaps or underlaps, the resonator half-cycle does not matter materially, as indicated in the graph of FIG. 4.

It would be observed that the resonant tank circuit may be considered to be included as part of the generator, rather than as the load, in which event there is provided a sine-wave generator that can drive any sort of load, even another resonant load, such as a VLF antenna. Use of more than one resonator tank will, moreover, improve the quality of the sine-wave delivered to the load, by reducing the sideband content at the pulse-repetition frequency harmonics of order $N-1$ and $N+1$. The lower the loaded Q of the resonator, the more noticeable the sidebands will be.

Early in the fill-up interval, discharge energy from the d.c. supply enters the pulse generator circuit G much faster than harmonic energy gets delivered to the tank resonator. If left unrestrained, the capacitor voltage $e_c(t)$ would build up to destructive levels after just a few discharges. The clamping circuit, so labelled in FIG. 1, establishes a voltage limit for the (symmetrical) positive and negative excursions of $e_c(t)$, beyond which some of the discharge current is fed back into the power supply. The clamping level is set at a multiple of the half-supply voltage by a low-leakage autotransformer $T_2$ and clamping diodes $D_1$ and $D_2$. When $e_c(t)$ passes the positive threshhold during a discharge through $SCR_2$ and $L_2$, diode $D_2$ conducts and diverts some of the pulse current through $T_2$ and into the upper d.c. supply. The current out of $e_c$ returns to the discharge loop via $L_4$ to $C_2$, and via the lower d.c. supply and $L_3$ to $C_1$.

Figure 5:
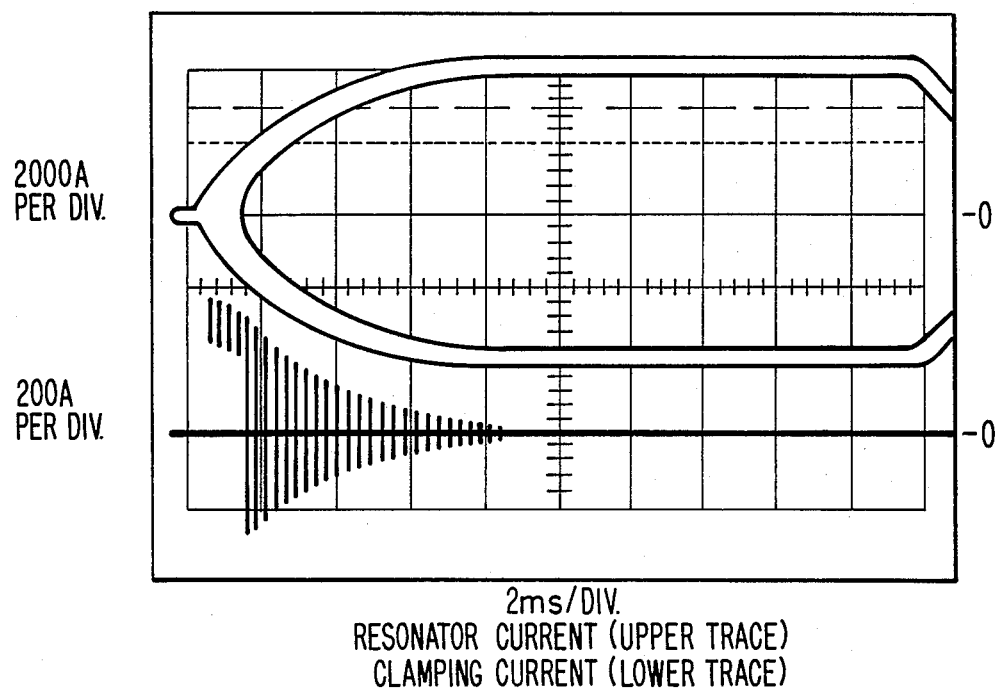
FIG. 5 is an oscillogram showing the resonator current and effective clamping against the condition of the excitation energy exceeding the rate of harmonic energy utilization in the tank resonator circuit.

FIG. 5 shows, for an 18 kHz current circulating in the tank resonator, the current passing from point $e_c$ into the clamping transformer. The latter current has proved very useful as a tuning indicator. Limiting the capacitor voltage also limits the pulse discharge current through the main SCRs, so that for load impedances down to a short circuit, the clamped pulse generator behaves like a current source.

The pulse-generator circuit of FIG. 1 is also vulnerable to a fault condition called "latch-up" or "shoot-through" wherein both $SCR_1$ and $SCR_2$ conduct simultaneously, shorting out the main d.c. supply. Latch-up can be precipitated by false triggers generated in the gating logic, transients which cause forward breakover of a non-conducting SCR, degradation of SCR turnoff characteristics from excessive junction temperature, etc. Current-limiting fuses in the d.c. supply lines can be sized to open before the SCRs are damaged, and provide a useful final defense against latch-up. The nuisance and expense of fuse replacement can be considerable, particularly during development of a new circuit.

The circuit in FIG. 1 employs a very effective latch-up inhibitor as explained in U.S. Pat. No. 3,832,573. The SCR pulse generator is isolated from the d.c. power supply by coupled coils $L_3$ and $L_4$, whose total series inductance, including the additive mutual inductance, is several times that of the discharge inductors $L_1$ and $L_2$. Simultaneous conduction of $SCR_1$ and $SCR_2$ causes the large filter capacitor $C_3$ to resonantly discharge through $L_1$ and $L_2$, and initiates a recharge of $C_3$ from the power supply via $L_3$ and $L_4$. If losses are low and $L_3 + L_4 \geq 5(L_1 + L_2)$, the discharge current through $SCR_1$ and $SCR_2$ will reverse direction and clear the fault. Capacitor $C_3$ then resonantly recharges from a slightly negative polarity toward twice the normal supply voltage, a potentially dangerous level.

The coupled coils $L_3 + L_4$ are provided with respective companion windings $L_3{}^1$ and $L_4{}^1$, as shown in FIG. 1, to provide a voltage step-up ratio '$\eta$' with respect to the total voltage applied to the coupled coil pair $L_3 + L_4$. A diode $D_3$ in series with the step-up winding is connected so that during normal operation, a back bias of $E_{dc}$ is applied. Following a latch-up, as the recharge of $C_3$ proceeds beyond the usual operating level of $E_{dc}$ to a higher level $E_{dc} + \Delta$, a voltage $\eta\Delta$ appears across the step-up winding. Diode $D_3$ will conduct when $\eta\Delta$ exceeds $E_{dc}$, transferring the capacitor recharging current from $L_3 + L_4$ to the step-up winding and thereby terminating the re-charge of $C_3$. The current in the step-up winding passes into the power supply, and soon ramps to zero. A voltage-sensing circuit across $C_3$ detects when a latch-up occurs, and inhibits the SCR gates until the fault clears and the re-charge transient dies out.

There is a conflict in the circuit of FIG. 1 between the clamping circuit $T_2$, $D_1$ and $D_2$ and the latch-up protection system. For best clamping, we would like to minimize the circuit inductance in the path $e_c$, $T_2$, $D_2$, $L_4$ around upper capacitor $C_2$, and in the companion path to the lower side of $C_1$ via the lower d.c. supply and $L_3$.

But for the latch-up protection circuit to work, we need $L_3 + L_4 \geq 5 (L_1 + L_2)$, as before stated, by mutually coupling the coils $L_3$ and $L_4$ in the sense indicated by the dots in FIG. 1. We get the extra mutual inductance $2M_{34}$ added to the self-inductance $L_3 + L_4$ for the series discharge circuit mode utilized in latch-up. Better still, for clamping, the (equal) return currents to (equal) capacitors $C_1$ and $C_2$ through $L_4$ and $L_3$ respectively passes through the coupled assembly in the same direction, so that the (undesireable) total inductance added to the clamping loop is reduced by the mutual coupling to $L_3L_4-M_{34}^2/L_3+L_4+2M_{34}$. For the usual case where the self-inductances $L_3$ and $L_4$ are equal, it turns out that the effective "latch-up" inductance is many times the "clamping" inductance of the mutual coupling.

Further modifications will also occur to those skilled in this art and such are considered to fall within the spirit and scope of the invention as defined in the appended claims.

What is claimed is:

1. A method of exciting a resonant circuit to generate radio-frequency oscillations, that comprises, generating spaced half-cycle pulses to a resonator circuit to excite radio-frequency oscillations therein, tuning the frequency of the resonant circuit to have a period 1/N that of the period between successive similar polarity pulses, where N is an odd integer greater than 1, so as to generate oscillations at the Nth harmonic of what would be a full period of said pulses, and adjusting the value of N and the fixed width and amplitude of the pulses to provide appropriate harmonic relationships of pulse repetition frequency and the harmonic oscillation frequency excited in the resonant circuit void of the constraint of a relationship between pulse and resonant circuit half cycles, the energy applied to the resonant circuit substantially compensating for an amount of dissipation of harmonic oscillation previously excited in the resonant circuit.

2. A method as claimed in claim 1 and in which said width of the half-cycle pulses is small compared to the width between successive pulses.

3. A method as claimed in claim 2 and in which the generating of the pulses is controlled to prevent energy accumulation in the tank circuit faster than the harmonic dissipation in the tank circuit.

4. A method as claimed in claim 2 and in which said generating of the pulses is effected by sequentially operating SCR-switching and saturable magnetic circuits.

5. A method as claimed in claim 4 and in which SCR operation is inhibited for the duration of any latch-up fault that may occur in the SCR switching circuits due to simultaneous conduction of two sequentially operating SCRs.

6. Apparatus for generating radio-frequency oscillations, having, in combination, means for generating sequentially spaced half-cycle pulses of alternately opposite polarity, means for coupling said pulses to tank resonator circuit means to excite the same into oscillation, means for tuning the frequency of said resonator circuit means to cause the same to oscillate at a harmonic frequency of period 1/N that of the period between successive similar polarity pulses, and means for adjusting the width and amplitude of the half-cycle pulses to cause the energy thereof applied to the resonator circuit means to substantially compensate for an amount of dissipation of harmonic oscillation previously excited in the said tank resonator circuit means.

7. Apparatus as claimed in claim 6 and in which the value of N is 3.

8. Apparatus as claimed in claim 6 and in which said generating means comprises push-pull sequential SCR-controlled magnetic pulse generating circuit means.

9. Apparatus as claimed in claim 8 and in which clamping means is provided connected to the SCR-controlled generating circuit means to prevent energy accumulation in the tank circuit means faster than the harmonic dissipation in the tank circuit means.

10. Apparatus as claimed in claim 9 and in which means is provided for inhibiting any latch-up fault wherein two push-pull SCRs simultaneously conduct.

11. Apparatus as claimed in claim 6 and in which the value of N is 5.

* * * * *